United States Patent [19]

Laupman

[11] 4,349,787
[45] Sep. 14, 1982

[54] COMPRESSOR

[75] Inventor: Robert R. Laupman, Wychen, Netherlands

[73] Assignee: Novanex Automation N.V., Wychen, Netherlands

[21] Appl. No.: 119,010

[22] Filed: Feb. 6, 1980

[30] Foreign Application Priority Data

Feb. 9, 1979 [NL] Netherlands ..................... 7902045
Mar. 2, 1979 [NL] Netherlands ..................... 7902683

[51] Int. Cl.³ ............................................. H03G 3/20
[52] U.S. Cl. ................................... 330/284; 330/145
[58] Field of Search .............................. 330/284, 145

[56] References Cited

U.S. PATENT DOCUMENTS 3,576,449   4/1971   Howell .................. 330/145

Primary Examiner—James B. Mullins
Assistant Examiner—Gene Wan

[57] ABSTRACT

Compressor for use with an audio amplifier, and of the type wherein a junction FET connected to the input of an amplifying means, has its control terminal connected (a) to the output of said amplifying means through a control transistor, and (b) to either a reference voltage lead through a first resistor, or the input of said amplifying means through another resistor. With such an arrangement the control action of said junction FET is automatically adjusted and adapted to the operating range of output signals of said amplifying means, without the need of separate trimming means. According to a further aspect of the invention a compressor of the above type and comprising a second transistor having its emitter-collector path included in a circuit between said first transistor and the output of said amplifying means, can be made to operate on sinusoidal and square-wave input signals as well without creating overload conditions in the load impedance, by connecting a relatively large resistor in parallel to said circuit wherein said emitter-collector path of said second transistor is included.

9 Claims, 17 Drawing Figures

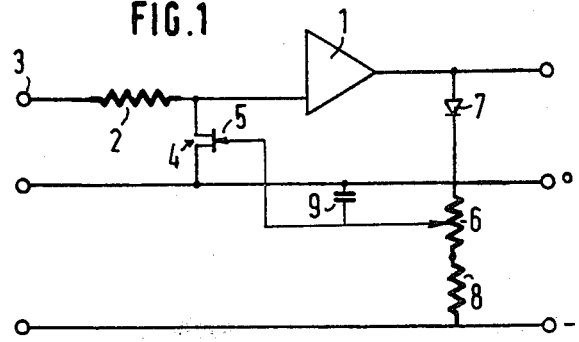
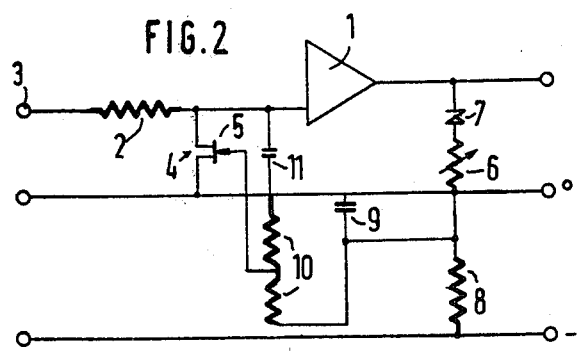
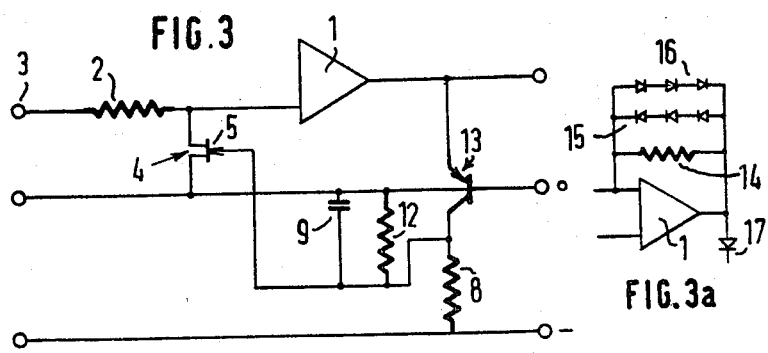

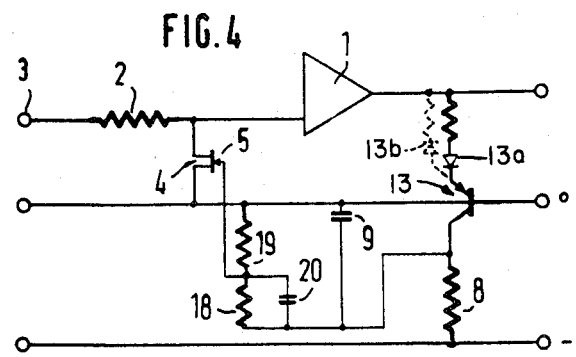
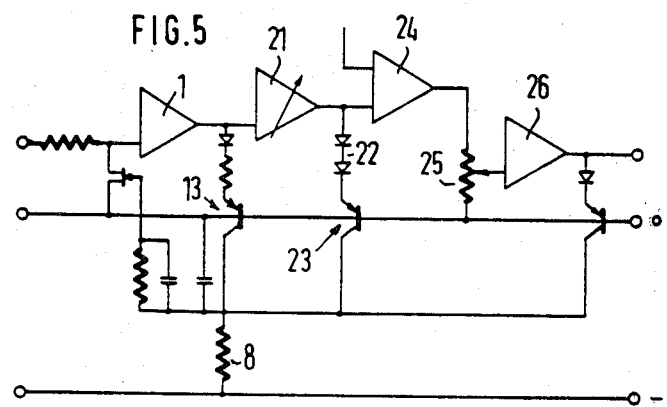
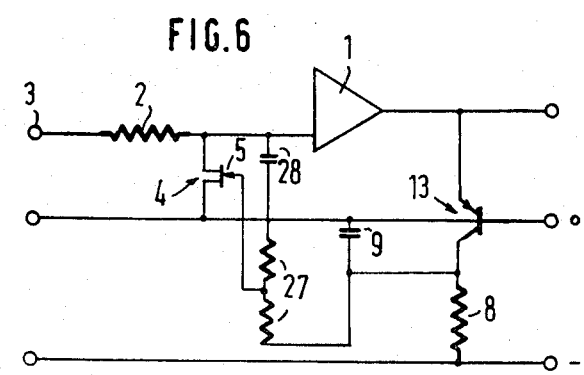

COMPRESSOR

Present-day compressors may be subdivided into two catagories, namely, those used in so-called Hi-Fi systems and those used in amplifiers for musical instruments.

In the first type of compressor, there is a pre-determined output voltage peak value, which when reached causes the volume to be rapidly reduced. The volume is then slowly increased again, until a next peak value indicates that another maximum signal has been reached. Accordingly, these compressors control the system for fast reduction in gain and slow increase in gain.

A disadvantage of this type of compressor is that the amplifier is slowly opened and when a peak value is reached is audibly closed.

On the second type of compressor, certain demands are made. In fact, in the case of amplifiers for musical instruments, it is required for these compressors to operate at high speed, that is to say, as a dynamic compressor. When, for example, as a musical instrument a guitar is considered, a very strong signal occurs when a string is plucked, and the "aftersound" is very weak relative to it. In reproducing this guitar sound, it is desirable to reproduce the "pluck" slightly louder and the "aftersound" hardly softer. Moreover, in this process, the action of the compressor must hardly, if at all, be audible.

It follows that the compressor of this type must reduce the gain very fast, but also must increase it again very fast. This in contrast to the above first type of compressor.

Moreover, in a musical-instrument amplifier, it is required for the compressor to allow a much greater overdrive of the input signal. A factor of 10,000 is quite attractive in this connection.

In many cases it is even attractive in musical-instrument amplifiers to suggest an overdrive of the amplifier in the form of the output signal, without this in fact taking place, and with the desired dynamical differences between the normal and overdrive condition being much slighter than suggested by the signals.

It is clear that when such demands are made, a musical-instrument amplifier must be provided with a fast-acting compressor, which can also control the intermediate stages of the signal to be amplified.

Such a fast-acting compressor offers the additional advantage over the so-called Hi-Fi compressor in musical-instrument amplifiers of a greater produced power which, if desired, may practically be continuously maximum.

In view of the above requirements, in such a compressor for use with a musical-instrument amplifier it is preferable to use a junction-FET, which has a number of properties which are of great utility in the case under consideration. Thus the action of such a FET is bidirectional up to approximately 100 mV, and accordingly it is capable of controlling a signal of up to 100 mV AC-voltage. In the second place, the control input, i.e. the gate input, of such a FET is very high-ohmic. Consequently, the control signal can be retained with a small capacitor. On the other hand, the voltage condition of this small capacitor can be very rapidly varied without this requiring a large control current.

Above the above-mentioned value of approximately 100 mV, such a FET can also operate bidirectionally, provided half of the signal voltage is superimposed upon the control voltage for the gate electrode; in this connection reference is made to the disclosure in Dutch patent application No. 7307129.

A further disadvantage of a junction-FET is its great reliability in operation.

A disadvantage of such a FET is, however, that the control voltage on the gating electrode greatly varies as regards operating range, i.e. this may vary within wide limits from FET to FET. This involves that when such a FET is used in a compressor it is necessary, owing to the variable specification of the FET, to adjust its operating range, e.g. using a trimmer. This is necessary in both the above range below approximately 100 mV and above it.

It is clear that the need for such a trimmer is in a great many cases objectionable. In the first place, adjustment should be effected from FET to FET; in the second place this adjustment must be effected by more or less skilled persons, and in the third place, the presence of such a trimmer makes the construction of the compressor more or less complex.

It is a first object of the present invention to eliminate this disadvantage of the required adjustment.

For this purpose, in a compressor for use in an audio amplifier, comprising an amplifying means and a compression circuit arrangement connected between the output and an input thereof, and including a controllable semi-conductor device connected between said input and a reference voltage line of the compressor, the gating electrode of which semi-conductor device is coupled through a control voltage control means to said output, and also through a capacitor to said reference voltage line, according to the present invention the control means is a transistor whose emitter or bases is coupled to said output, the collector to the control electrode and through a resistor to the negative voltage line of the compressor, and the base or emitter to the reference voltage line, the control electrode being further coupled through a resistor to the reference voltage line or the input of the amplifying means, in dependence on the operating range.

In a preferred embodiment of a compressor according to the invention, said transistor serving as a control voltage means is included in the circuit arrangement in such a manner that the emitter or the bases is connected via the collector-emitter path of a second transistor and a first resistor to the output of said amplifying means, the base or the emitter is connected to the reference voltage line, and the collector is connected to both the control electrode of said controllable semi-conductor device and through a second resistor to the negative voltage line of the compressor, the base of said second transistor being connected to the junction between two series-connected resistors, which series-connected resistors are connected between the reference voltage line and the positive voltage line of the compressor.

It turns out that such a preferred embodiment, which is mains voltage dependent, operates satisfactorily if sinusoidal voltage waves are supplied to the input of the compressor. For in that case substantially sinusoidal output signals are also produced at the output of the circuit, which signals are then limited by the compressor in the manner desired.

It is conventional for the consumer following such a circuit arrangement, such as, for example, a loudspeaker, to be so dimensioned that it optimally processes the output waves referred to.

If, however, instead of sinusoidal input waves, for example, rectangular input waves are presented to the input of the compressor, whose zero crossings are spaced the same distance from each other as those of the relevant sine waves, and whose maximum amplitude corresponds to that of the sine waves, a likewise substantially rectangular output wave occurs at the output of the compressor, but whose energy content, as is well known, is greater by a certain factor than the output sine wave under consideration. This means that the consumer following the compressor, in particular the loudspeaker, is overloaded, as it is optimally dimensioned for sine waves only.

It is accordingly a further object of the invention to eliminate the disadvantage outlined above.

For this purpose, according to the invention, a third resistor is connected in parallel to the series-connection of the emitter-collector path of the second transistor and the first transistor, the value of which third resistor is great relative to that of said first resistor.

The invention will be described in greater detail hereinafter with reference to the accompanying drawings, in which, FIG. 1 shows a compressor provided with a FET, and using a trimmer for adjusting the operating range of the FET, which compressor is designed for use in a range below approximately 100 mV;

FIG. 2 shows a similar compressor provided with a trimmer, but designed for use in a range above approximately 100 mV;

FIG. 3 shows an embodiment of a compressor according to the present invention;

FIG. 3a shows a variant of the embodiment shown in FIG. 3;

FIG. 4 shows a different embodiment of a compressor according to the present invention;

FIG. 5 shows an extension of a compressor according to the present invention with a plurality of stages;

FIG. 6 shows an embodiment of a compressor according to the present invention, designed to operate in a range above approximately 100 mV;

Figure 7:
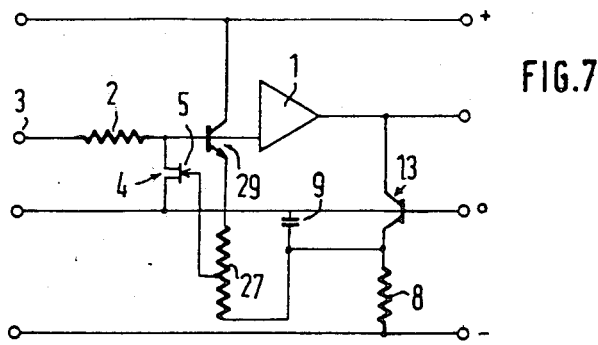
FIG. 7 shows an improved embodiment of a compressor as shown in FIG. 6.

FIG. 1 shows an embodiment of a compressor designed for signals of no higher than approximately 100 mV. As shown in this figure, the compressor is built up from an operational amplifier 1, whose inverse (negative) terminal is connected through a resistor 2 to the input terminal 3. Connected between the end of a resistor 2 remote from terminal 3 and the neutral line designated by 0 is a FET 4, in particular a junction-FET, in this case of the n-channel type. The gating electrode 5 of this FET 4 is connected to the movable contact of a rheostat 6. As shown, this rheostat 6 is connected in series with a diode 7 and a fixed resistor 8 between the output of the operational amplifier 1 and the negative line. Furthermore, there is provided a capacitor 9 between the gating electrode 5 of FET 4 and the neutral line.

As explained above, rheostat 6 is necessary in connection with the great variation generally encountered in FETs. The presence of this rheostat or trimming resistor 6 has a number of objections, which have also been explained in some detail hereinbefore.

FIG. 2 illustrates a similar compressor, but designed for signal voltages above approximately 100 mV. Here again, the inverse input of an operational amplifier 1 is connected through a resistor 2 to the input terminal 3, and a FET 4 is provided between the end of resistor 2 remote from terminal 3 and the neutral line. The gating electrode 5 of FET 4 is connected to the junction of two like series-connected resistors 2. These resistors are series-connected to resistor 8 and a capacitor 11 between the input line and the negative line of the compressor. This circuit further comprises parts 6, 7 and 9 as also provided in the arrangement of FIG. 1. The diode 7 of the arrangement of FIG. 1, however, is here shown as a Zener diode. The circuit again shows that in this case, too, a rheostat, i.e, a trimming resistor 6 is required with all the objections of that.

To eliminate the disadvantages referred to, according to the present invention, the compressor shown in FIG. 1 is designed in a manner as shown in FIG. 3 of the accompanying drawings. As shown in FIG. 3, there is provided a transistor 13 connected between the output of the operational amplifier 1 and the negative line in series with resistor 8, already mentioned, of which transistor 13 the emitter is connected to the output line, the collector to the negative line and the base to the neutral line of the compressor. The gating electrode 5 of FET 4, which, as described, is present between the input line and the neutral line of the compressor, is connected to the collector of this transistor 13. Provided between the gating electrode 5 of FET 4 and the neutral line, is again a capacitor 9, to which a resistor 12 is parallel-connected. It now turns out that the negative gating electrode voltage of the FET 4 is determined by the ratio of the resistance values of resistors 8 and 12. This ratio is selected so that FET 4 is fully blocked in the normal operative condition of the arrangement. This means that the input signal is transmitted freely through the operational amplifier 1. When the output peak voltage of the operational amplifier 1 rises above a pre-determined value of, e.g., 0.4 V, however, which value corresponds to the emitter-base voltage of transistor 13, then this affects resistor 8 and capacitor 9 in such a manner that FET 4 becomes conductive. Accordingly, it turns out that an automatic adjustment of the bias of FET 4 is obtained, which pre-adjustment is determined by the ratio of the resistance values of said resistors 8 and 12, and which no longer needs to be adjusted from FET to FET in connection with the variation therein. It is clear that, owing to this feature, i.e. the elimination of the trimming resistor, the operation of the compressor as has hitherto been necessary is greatly simplified.

It is noted in this connection that, if desired, a diode 13a, or Zener diode 13b, may be included between the output of the operational amplifier 1 and the emitter of transistor 13. This is shown in the figure.

FIG. 3a illustrates a variant of the embodiment of the invention shown in FIG. 3, in which a system is included between the output of operational amplifier 1 and the non-inverting input thereof, which system is built up from three parallel branches, the first of which comprises a resistor 14, the second branch comprises one or more diodes 15 poled in a given direction, and the third branch of which comprises one or more diodes 16 poled in opposite direction. This embodiment comprises the diode, not shown in FIG. 3, between the output of operational amplifier 1 and the emitter of transistor 13, as diode 17. As regards the operation of the system built up in the above-described manner between the output terminal and the non-inverting input terminal of the operational amplifier 1, reference is made to Dutch patent application No. 7307129.

It has been found that when a signal from, for example, a guitar or a piano or other impact instrument is regarded as a function of time, the configuration thereof has a steep leading edge and a rather rapidly decreasing trailing edge. As stated above, the object is for the trailing edge to be increased in order to improve the "aftersound". This is realized with a compressor and, in particular, in an elegant manner with a compressor according to the present invention, but it turns out that the trailing edge of the resulting improved signal still exhibits a so-called "dip" right behind the peak value of the signal, which has an unpleasant effect. This effect can be eliminated by means of a compressor formed as shown in FIG. 4 of the accompanying drawing.

The compressor shown in FIG. 4 corresponds in many respects with those already described, and indeed like references have been used to designate like parts. In the arrangement of FIG. 4, resistor 12 of the arrangement of FIG. 3 has been split into two parallel resistors 18, 19, the junction of which resistors is connected to the gating electrode 5 of FET 4. Connected in parallel to resistor 18 is a capacitor 20. The parts have been dimensioned so that resistor 8 has a great value, capacitor 20 a small value and capacitor 19 a great value.

As regards the operation of this compressor, it is noted that, if the output voltage of operational amplifier 1 increases to a value equal to two diode voltages occurring across, respectively, diode 17 and the diode portion of transistor 13, capacitor 9 will be discharged. This control voltage is divided over the voltage divider formed by resistors 18 and 19. The small capacitor 20 will try to prevent this for a short time. This means that the gating electrode 5 of FET 4 is rapidly driven into its open position and, in the absence of a further control signal, will tend to close again.

The result of this effect is that the above-cited dip in the output signal, occurring in the trailing edge of the signal, is substantially eliminated.

A further advantage of a compressor according to the present invention is that it can be extended with a number of further stages as shown, for example, in FIG. 5. The left-hand portion of this figure again shows the compressor as shown in FIG. 4. The output of the operational amplifier 1 is connected to the input of a further operational amplifier 21 which, for example, may be a tone control device, as indicated diagrammatically by the arrow in this operational amplifier. The output of this operational amplifier 21 is connected through one or more diodes 22 to the emitter of a further transistor 23, which is connected in like manner as transistor 13 of the preceding stage.

The output of the operational amplifier 21 may again be connected to a further operational amplifier 24, which by way of example is here shown as a mixing stage, it being possible for the second signal to be supplied to the non-inverting input of this amplifier, as shown diagrammatically in the drawing. The output of this operational amplifier may be connected through a voltage divider 25 to again a further operational amplifier 26, which may be constructed in the manner of the first or the second stage.

The above shows that the compressor according to the invention can be extended in an extremely simple and elegant manner with a random number of further stages, while the level of control per stage can be freely selected.

In the above, the arrangement has been described for the case that the compressor is designed to operate at a signal voltage below approximately 100 mV.

FIG. 6 illustrates an embodiment of a compressor serving to operate at signal voltages above this value.

In this embodiment the gating electrode 5 of FET 4 is connected to the junction of two series-connected resistors, jointly designated by 27, one end of this resistor combination being connected to resistor 8, and the other end through a capacitor 28 to the inverting input of the operational amplifier 1. For the rest, the arrangement of this compressor corresponds to that described hereinbefore.

As regards the operation of this compressor, it is noted that when the value of the output signal of the operational amplifier reaches the emitter-base voltage value of transistor 13, capacitor 9 is discharged. In that case FET 4 is closed. i.e. becomes conductive, and the signal is rapidly adjusted.

It is noted, however, that capacitor 28 thereafter follows the voltage of capacitor 9, which leads to FET 4 being essentially opened too far, the result of which is that the trailing edge of the output signal of operational amplifier 10 again exhibits a dip, as described hereinbefore.

This means that the presence of capacitor 28 is undesirable. The above-described disadvantage of this embodiment can be remedied by replacing said capacitor 28 by a transistor as shown in FIG. 7 of the drawings.

The arrangement of the compressor shown in FIG. 7 fully corresponds to that of FIG. 6, except that now capacitor 28 has been replaced by a transistor 29, whose emitter is connected to the upper end of the resistor combination 27, as viewed in the drawing, the collector to the plus lead, and the base to the inverting input of the operational amplifier 1. It is found that when a compressor is arranged in this manner the above dip in the output signal of the operational amplfier 1 no longer occurs.

As described in patent application No. 7307129, mains voltage variations have a great effect on the operation of a compressor. For when the mains voltage decreases the compressor does not utilize the peak power which is present with full capacitors.

Figure 8:
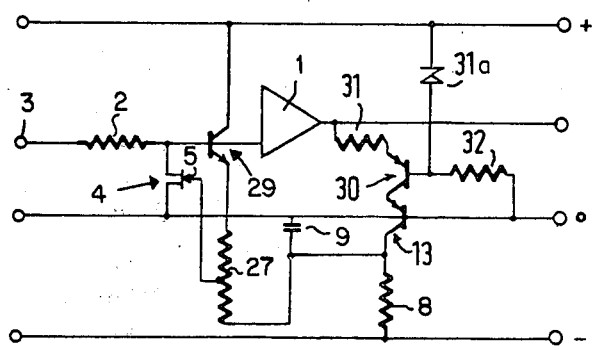
FIG. 8 shows a compressor according to the present invention, which is mains-dependent.

In a compressor according to the invention, this disadvantage can be met in an extremely simple manner, namely, as shown in FIG. 8 of the accompanying drawings.

The compressor shown in this figure comprises a large number of parts, as already found in the preceding embodiments, and which are therefore described by like reference numerals. A difference is that, unlike the embodiment of FIG. 7, the emitter of the transistor 13 is connected not directly to the output of the operational amplifier, but to the collector of a transistor 30 connected to said output. Of this transistor, the emitter is connected through a resistor 31 to the output of the operational amplifier, and the base is connected to the junction of a system comprising a Zener diode 31a and a resistor 32, connected between the neutral line and the plus line. In a circuit arranged in this manner the output voltage of the operational amplifier 1 is always at a maximum value, even for peak values, when the capacitor voltages admit this.

Figures 8A, 8B:
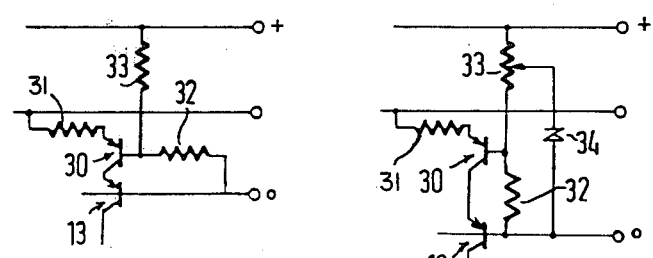
FIG. 8a shows a variant of the embodiment shown in FIG. 8.
FIG. 8b shows a different variant of the embodiment shown in FIG. 8.

The embodiment of such a mains voltage dependent compressor shown in FIG. 8 may be modified as shown in FIGS. 8a. and 8b.

In the arrangement of FIG. 8a, the Zener diode 31 has been replaced by a resistor 33, while in the arrangement of FIG. 8b a Zener diode 34 is provided, one terminal of which is connected to the neutral line, and the other to a movable contact of resistor 33.

When the maximum output voltage of the operational amplifier 1 is regarded as a function of the mains voltage, there is a linear characteristic in the embodiment of FIG. 8 a likewise linear but less steep one in the embodiment of FIG. 8a, and in the embodiment of FIG. 8b the characteristic is similar to the one first mentioned as far as the first portion is concerned, whereafter at a mains voltage value of e.g. 220 V the characteristic extends horizontally. This horizontal configuration is due to the presence of the Zener diode 34.

It is clear that capturing parts as described in patent application No. 7307129 can be used between the emitter of transistor 13 and the output of amplifier 1.

Figure 9:
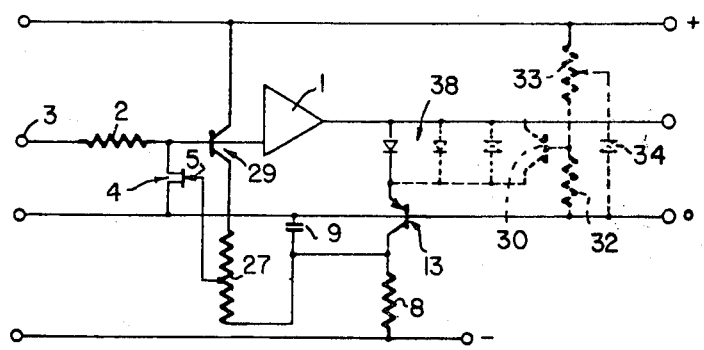
FIG. 9 shows still another embodiment of a compressor according to the present invention, with a number of variants being shown in dotted lines.

Thus FIG. 9 shows the compressor illustrated in FIG. 7, with some variants of such parts being shown in dotted lines by way of alternatives.

Figure 10:
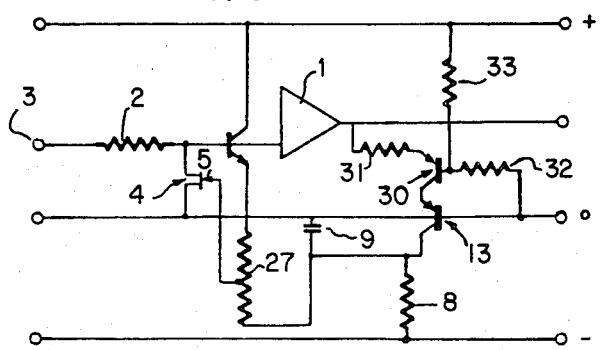
FIG. 10 shows a further variant of a compressor according to the present invention.

The embodiment with transistor 30 thereof, as shown on the right-hand side of FIG. 9 is again fully illustrated in FIG. 10. A compressor of this type exhibits the same characteristic as one in which, instead of transistor 30 with partial resistors, use is made of a diode 38 as shown dotted in FIG. 9.

It is clear that transistor 13 may also be so connected that its emitter is connected to the reference voltage lead, and its base to the output of amplifier 1. The operation is then essentially similar to that of the above-described circuit arrangements, except that in the case last-mentioned the gain of the transistor plays a role, which must be taken into account, and furthermore temperature effects may occur, which can be compensated for in a simple manner, for example, by means of a resistor provided between the base of the transistor and the reference voltage lead. All this makes this embodiment less attractive than those described hereinbefore, but its operation is very satisfactory.

The above will show that the present invention provides a compressor for musical-instrument amplifiers in which no after-adjustment of the bias of the FET used therein is required, and which has a number of additional favourable properties, as explained in detail hereinbefore.

Figure 11:
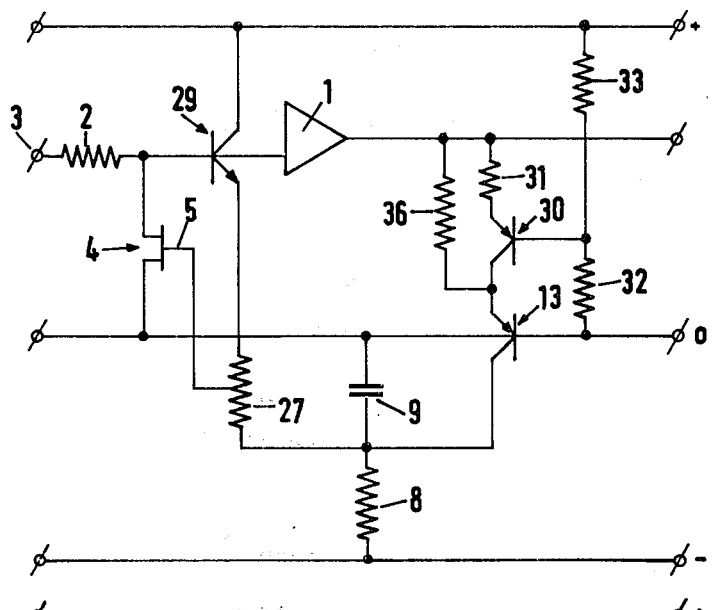
FIG. 11 shows a compressor circuit substantially similar to that shown in FIG. 8, but in which, according to a further aspect of the present invention, there is provided a third resistor.

FIG. 11 of the drawings illustrates a compressor largely similar to that shown in FIG. 8. The circuit is arranged to be mains voltage dependent and is designed for processing signals occurring in a given operational range, e.g. above approximately 100 mV. The arrangement and operation of such a circuit is explained in detail hereinbefore.

It turns out that when substantially sinusoidal input signals are presented to the input terminal of the circuit, these are limited in the correct manner by the compressor circuit to produce limited sinusoidal output signals at the output terminal. These output signals are supplied to a consumer not shown following the compressor circuit, such as a loudspeaker.

It is conventional for this loudspeaker to be designed for optimally processing these output signals. If, however, e.g. rectangular signals are presented to the input of the compressor, which are assumed to have the same cycle as the above sinusoidal signals and in addition the same amplitude, difficulties occur as the energy content of the limited rectangular output signals occurring at the output terminal of the compressor is greater than the energy content of a corresponding sinusoidal output wave by a certain factor. As a consequence the consumer, in the present case the loudspeaker, is overcharged with all adverse results of that.

It is a further object of the present invention to eliminate this disadvantage.

For that purpose, according to a further aspect of the invention, a resistor 36 is connected in parallel to the emitter-collector path of transistor 30 and the resistor 31 connected in series therewith, the value of which resistor 36 is high relative to the value of resistor 31.

In the presence of sinusoidal signals, a limiting effect is introduced, which is essentially similar to that which takes place in the compressor circuit as shown in FIG. 8.

Figure 13:
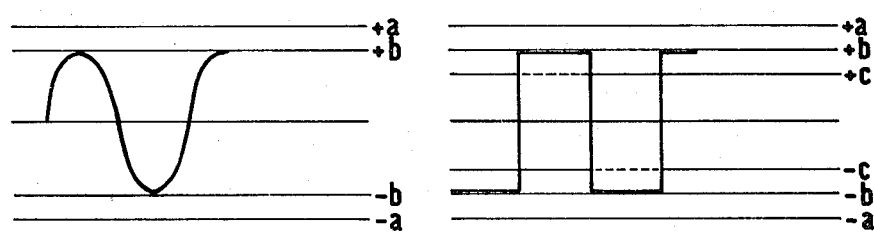
FIG. 13 illustrates a sinusoidal output voltage and a rectangular output voltage.

When rectangular signals occur, however, the large resistor 36 plays an integrating part and reduces the already limited amplitude of the rectangular waves, as shown in FIG. 13 at b, further down to a level shown in FIG. 13 at c.

When the dimensioning of resistors 36 and 31 is selected in a suitable manner, it can be ensured that the energy content of the rectangular output wave, twice reduced in the manner described above, becomes substantially equal to that of the once-reduced sinusoidal output wave. This means that even in the case of a rectangular signal way there will be no overcharging of the consumer, such as a loudspeaker.

In the embodiment of FIG. 11, the base of the transistor 13 serving as a control means is connected to the reference voltage lead or earth, while this transistor is controlled via the emitter thereof and from the sensing circuit comprising transistor 30 in order that capacitor 9, charged via resistor 8 may be discharged at the moment when the excitation exceeds a certain threshold value. In this embodiment the sensing circuit is connected between the positive voltage lead and the reference voltage lead, while as regards transistor 13 the emitter current is virtually equal to the collector current.

Figure 12:
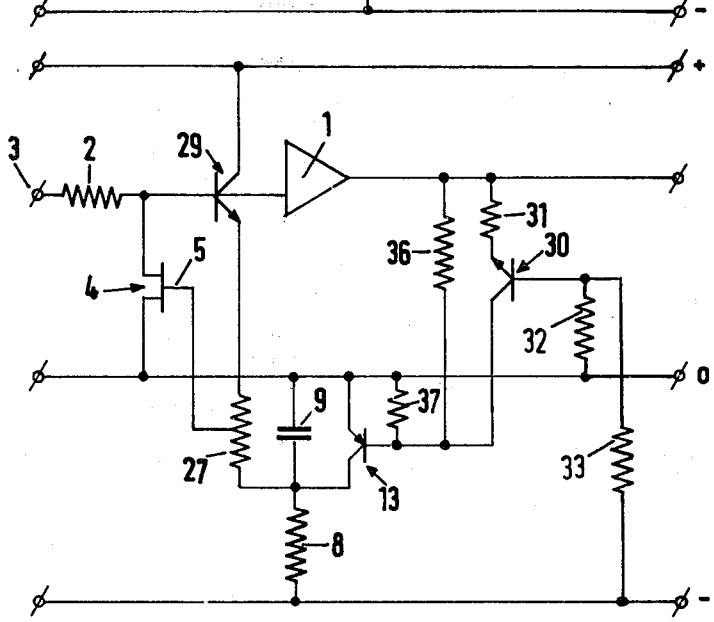
FIG. 12 shows a circuit similar to that of FIG. 11, but in which the transistor serving as the control voltage control means is connected in a different manner.

FIG. 12 shows a variant of the circuit shown in FIG. 11, with transistor 13, which serves as the control means, being connected in a slightly different manner from the arrangement shown in FIG. 11. In this case the emitter is connected to the reference voltage lead and the base is controlled from the sensing circuit; this sensing circuit is connected between the negative voltage lead and the reference voltage lead and in this way forms, as it were, the mirror image of the sensing circuit of the arrangement shown in FIG. 11. With the operation being otherwise the same, in the embodiment of FIG. 12 the transistor operates as an amplifier. It is noted that in this alternative embodiment of FIG. 12, extra measures must be taken to produce a control equally effective as that obtained with the circuit of FIG. 11. One of these measures is that a resistor 37 is provided between the base of said transistor 13 and the reference voltage lead, which resistor 37 serves as a thermal compensation means.

It follows from the above that owing to the addition of only one additional part, i.e. resistor 36, and the specific dimensioning of this resistor relative to resistor 31, an overcharging of the consumer when non-sinusoidal signals are used, in particular rectangular signals, is eliminated. In this way, therefore, a universal compressor is provided.

I claim:

1. A compressor for use in an audio amplifier, comprising an amplifying means with an input and an output, and a compression circuit connected between the output and input, said compression circuit comprising a controllable semi-conductor device in the form of a FET connected between said input and a reference voltage lead of the compressor, the control electrode of which semiconductor device is connected through a control voltage control means to said output and also through a capacitor to the reference voltage lead, said control means being a transistor having a collector electrode, an emitter electrode and a base electrode, one of said emitter and base electrodes being connected to said output, the collector electrode to the control electrode and through a resistor to a negative voltage lead of the compressor and the other one of said base and emitter electrodes to the reference voltage lead, the control electrode being further connected through a resistor to one of said reference voltage lead and the input of the amplifying means, a circuit being provided between the output and input of the amplifying means, said last mentioned circuit comprising three parallel branches, the first of which comprises a resistor, the second at least one series-connected diode poled in one direction, and the third at least one series-connected diode poled in the opposite direction, there being provided a diode between the output of the amplifying means and one of said emitter and base electrodes of the transistor.

2. A compressor for use in an audio amplifier, comprising an amplifying means with an input and an output and a compression circuit connected between the output and input said compression circuit comprising a controllable semi-conductor device in the form of a FET connected between said input and a reference voltage lead of the compressor, the control electrode of which semi-conductor device is connected through a control voltage control means to said output and also through a capacitor to the reference voltage lead, said control means being a transistor having a collector electrode, an emitter electrode and a base electrode, one of said emitter and base electrodes being connected to said output, and the collector electrode to the control electrode and through a resistor to a negative voltage lead of the compressor and the other one of said base and emitter electrodes to the reference voltage lead, the control electrode being further connected through a resistor to one of said reference voltage lead and the input of the amplifying means, the output of the amplifying means being connected to an input of a further amplifying means forming part of a system consisting of at least one amplifying means connected in cascade, the output of at least one of the amplifying means of said further amplifying means being connected through at least one diode to one of the emitter and base electrodes of an associated further transistor, the collector electrode of which is connected to the collector electrode of the transistor, and one of the base and emitter electrodes of which is connected to the reference voltage lead.

3. A compressor for use in an audio amplifier, comprising an amplifying means with an input and an output and a compression circuit connected between the output and input said compression circuit comprising a controllable semi-conductor device in the form of a FET connected between said input and a reference voltage lead of the compressor, the control electrode of which semi-conductor device is connected through a control voltage control means to said output and also through a capacitor to the reference voltage lead, said control means being a transistor having a collector electrode, an emitter electrode and a base electrode one of said emitter and base electrodes being connected to said output and the collector electrode to the control electrode and through a resistor to a negative voltage lead of the compressor and the other one of said base and emitter electrodes to the reference voltage lead, the control electrode being further connected through a resistor to one of said reference voltage lead and the input of the amplifying means, said control electrode being connected through said resistor to the input of the amplifying means, the end of the resistor connected to the input being connected to the emitter electrode of a second transistor, the collector electrode of which is connected to a positive voltage lead of the compressor and the base electrode to the input of the amplifying means.

4. A compressor as claimed in claim 3, wherein one of said emitter and base electrodes of the transistor is connected to the collector electrode of a third transistor, the emitter electrode of which is connected through a resistor to the output of the amplifying means, and the base electrode of which is connected through a resistor to the reference voltage lead and to the positive voltage lead.

5. A compressor as claimed in claim 4, wherein a diode is arranged between the base electrode of the third transistor and the positive voltage lead.

6. A compressor as claimed in claim 4, wherein a further resistor is arranged between the base electrode of the third transistor and the positive voltage lead.

7. A compressor as claimed in claim 6, which comprises a diode between a point of the further resistor and the reference voltage lead.

8. A compressor for use in an audio amplifier, comprising an amplifying means with an input and an output and a compression circuit connected between the output and input, said compression circuit comprising a controllable semi-conductor device in the form of a FET connected between said input and a reference voltage lead of the compressor, the control electrode of which semi-conductor device is connected through a control voltage control means to said output and also through a capacitor to the reference voltage lead, said control means being a transistor having a collector electrode, an emitter electrode and a base electrode one of said emitter and base electrodes being connected to said output, and the collector electrode to the control electrode and through a resistor to a negative voltage lead of the compressor and the other one of said base and emitter electrodes to the reference voltage lead, the control electrode being further connected through a resistor to one of said reference voltage lead and the input of the amplifying means, and a plurality of parallel diodes connected between one of said emitter and base electrodes of the transistor and the output of the amplifying means.

9. A compressor for use in an audio amplifier, comprising an amplifying means with an input and an output and a compression circuit connected between the output and input said compression circuit comprising a controllable semi-conductor device in the form of a FET connected between said input and a reference voltage lead of the compressor, the control electrode of which semi-conductor device is connected through a control voltage control means to said output and also through a capacitor to the reference voltage lead, said control means a transistor having a collector electrode, an emitter electrode and a base electrode, one of said emitter and base electrodes being connected to said output and the collector electrode to the control electrode and through a resistor to a negative voltage lead of the compressor and the other one of said base and emitter electrodes to the reference voltage lead, the control electrode being further connected through a resistor to one of said reference voltage lead and the input of the amplifying means, and a Zener diode connected between one of the emitter and base electrodes of the transistor and the output of the amplifying means.

* * * * *

UNITED STATES PATENT AND TRADEMARK OFFICE
CERTIFICATE OF CORRECTION

PATENT NO. : 4,349,787
DATED : SEPTEMBER 14, 1982
INVENTOR(S) : ROBERT R. LAUPMAN

It is certified that error appears in the above-identified patent and that said Letters Patent are hereby corrected as shown below:

On the title page

[30]   Foreign Application Priority Data

Feb.9,1979 [NL]   Netherlands ........... 7901045
   Mar.2,1979 [NL]   Netherlands ........... 7901683

Signed and Sealed this

Twenty-first Day of June 1983

[SEAL]

*Attest:*

DONALD J. QUIGG

*Attesting Officer*   *Acting Commissioner of Patents and Trademarks*